(12) United States Patent
Kikuchi

(10) Patent No.: US 6,222,784 B1
(45) Date of Patent: Apr. 24, 2001

(54) SEMICONDUCTOR MEMORY

(75) Inventor: Hidekazu Kikuchi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/591,347

(22) Filed: Jun. 9, 2000

Related U.S. Application Data

(62) Division of application No. 09/176,775, filed on Oct. 22, 1998, now Pat. No. 6,097,654.

(30) Foreign Application Priority Data

May 14, 1998 (JP) .................................................. 10-132094

(51) Int. Cl.$^7$ ........................................................ G11C 7/02
(52) U.S. Cl. ......................... 365/210; 365/51; 365/63
(58) Field of Search ........................ 365/210, 51, 63, 365/230.03

(56) References Cited

U.S. PATENT DOCUMENTS

| | | | |
|---|---|---|---|
| 5,255,231 | 10/1993 | Oh | 365/210 |
| 5,359,216 | 10/1994 | Coleman et al. | 257/306 |
| 5,483,495 | 1/1996 | Fukuda | 365/210 |
| 5,886,939 | 3/1999 | Choi et al. | 365/210 |
| 6,084,816 * | 7/2000 | Okamura | 365/207 |

FOREIGN PATENT DOCUMENTS

| | | |
|---|---|---|
| 6-318391 | 11/1994 | (JP) . |
| 7-135301 | 5/1995 | (JP) . |
| 9-139477 | 5/1997 | (JP) . |
| 10-93048 | 4/1998 | (JP) . |

* cited by examiner

*Primary Examiner*—Richard Elms
*Assistant Examiner*—VanThu Nguyen
(74) *Attorney, Agent, or Firm*—Jones Volentine, LLC

(57) ABSTRACT

A semiconductor memory of wherein the delay of control signals for controlling sense amplifiers is efficiently controlled without extensively changing a currently-used fabricating process. A dummy bit line pair are arranged between desired bit line pairs in the memory cell array. Since the dummy bit line pair is not related to a normal operation such as reading data stored in memory cells, it is not necessary to dispose a sense amplifier in an area of a sense amplifier array adjacent to the dummy bit line pair. As a result, there is formed a free area in the sense amplifier array. The free area has at least a width between the dummy bit line pair. This free area further forms a contact portion for electrically connecting sense amplifier control signal lines and low resistance sense amplifier control signal lines. That is, this free area is utilized as a shunt area of the sense amplifier control signal lines.

20 Claims, 8 Drawing Sheets

SEMICONDUCTOR MEMORY

CROSS REFERENCE TO RELATED APPLICATIONS

This is a divisional application of application Ser. No. 09/176,775, filed Oct. 22, 1998, now U.S. Pat. 6,097,654, which is hereby incorporated by reference in its entirety for all purposes.

BACKGROUND OF THE INVENTION

1. Field of the Invention

The invention relates to the layout of a semiconductor memory, particularly relates to the layout of a dynamic random access memory (DRAM) comprising a memory cell array in which memory cells are arranged in a matrix shape and a sense amplifier array which is disposed adjacent to the memory cell array.

2. Description of the Related Art

In recent years, a DRAM is required to operate increasingly at high speed. Various propositions have been put forth to realize this requirement.

For example, there is a proposition that wirings each having resistance lower than that of word lines are arranged adjacent to the word lines, and the word lines and the wirings having low resistance (hereinafter referred to as low resistance wirings) are connected to one another in word line shunt areas provided at given intervals, so that signals applied to the word lines are transmitted at high speed.

Japanese Patent Laid Open Publication No. 9-139477 published May 27, 1997 has put forth a proposition of the layout of word line shunt areas in a memory cell array in the interests of high speed operation.

If a desired word line is selected out of a plurality of word lines in a memory cell array, data in the memory cell connected to the selected word line is applied to a bit line. Data applied to the bit line is amplified by a given sense amplifier of a plurality of sense amplifiers in a sense amplifier array disposed adjacent to the memory cell array. The amplified data is applied to a data bus which is arranged in the sense amplifier array.

Considering the delay of a signal applied to the word line, a plurality of word line shunt areas are arranged in predetermined positions in the memory cell array. Such a delay of signal applied to the word line has received widespread attention.

However, the delay of a control signal for controlling a plurality of sense amplifiers has not received widespread attention so far, and hence no effective proposition has been put forth.

As miniaturization and high capacity of a DRAM have progressed in recent years, a sense amplifier circuit and a method of controlling it becomes complex. Accordingly, a load applied to sense amplifier control signal lines each transmitting a control signal for controlling a plurality of sense amplifiers becomes large. As a result, there occurs a delay of the control signal for controlling the sense amplifiers. It seems that this delay causes a serious problem when miniaturization and high-capacity of a DRAM increasingly progress.

SUMMARY OF THE INVENTION

It is an object of the invention to provide a semiconductor memory capable of efficiently controlling the delay of a control signal for controlling sense amplifiers without extensively changing a currently-used fabricating process.

It is another object of the invention to provide a semiconductor memory for improving capacitive balance of a data bus pair without extensively changing a currently-used fabricating process.

It is still another object of the invention to provide a semiconductor memory capable of realizing the reduction of power supply noise and improvement of latch-up tolerance without extensively changing a currently-used fabricating process.

It is more still another object of the invention to provide a semiconductor memory capable of miniaturizing a sense amplifier control portion and of reducing the number of sense amplifier control signal lines without extensively changing a currently-used fabricating process.

To achieve these objects, a typical invention of this application comprises as follows.

A semiconductor memory includes a plurality of bit line pairs which are arranged in parallel with one another, and a plurality of sense amplifiers each connected to ends of each bit line pair for amplifying the potential between the bit line pairs, wherein a sense amplifier corresponding to a given bit line pair of the plurality of bit line pairs is not arranged so as to secure a given area in the arrangement of a plurality of sense amplifiers.

The semiconductor memory includes sense amplifier control signal lines for transferring control signals for controlling the plurality of sense amplifiers and sense amplifier control signal lines having low resistance (hereinafter referred to as low resistance sense amplifier control signal lines) and extending substantially in parallel with the sense amplifier control signal lines and having resistance which is lower than that of the sense amplifier control signals, and sense amplifier signal line connecting portions formed in the given area for connecting the sense amplifier control signal lines and the low resistance sense amplifier control lines.

The semiconductor memory includes a power supply wiring formed in a semiconductor circuit board for supplying power, wherein the power supply wiring and the semiconductor circuit board are connected to each other in the given area.

The semiconductor memory further includes a data bus pair to which a voltage which is amplified by the plurality of sense amplifiers is applied, wherein the data bus pair have crossing portions in the given area.

The semiconductor memory further includes second sense amplifier control signal lines for transferring the control signals and a buffer circuit formed in the given area for connecting between the sense amplifier control signal lines and the second the sense amplifier control signal lines.

With such construction set forth hereinbefore, it is possible to provide a semiconductor memory capable of achieving the above objects without extensively changing a currently-used fabricating process.

BRIEF DESCRIPTION OF THE DRAWINGS

While the specification concludes with claims particularly pointing out and distinctly claiming the subject matter which is regarded as the invention, it is believed the objects and features of the invention and further objects, features and advantages thereof will be better understood from the following description taken in connection with accompanying drawings in which:

DESCRIPTION OF THE PREFERRED EMBODIMENT

A semiconductor device according to first to sixth embodiments of the invention will be described now with reference to the attached drawings.

In the following description, components directly associated with the invention are mainly explained and other components are omitted from explanation. The omitted components will be understood with reference to the publication set forth hereinbefore or the products of 64M synchronous DRAM, MD 56V62320, etc., manufactured by Oki Electric Industry Co., Ltd.

The semiconductor device according to the first embodiment is first explained.

Figure 1:
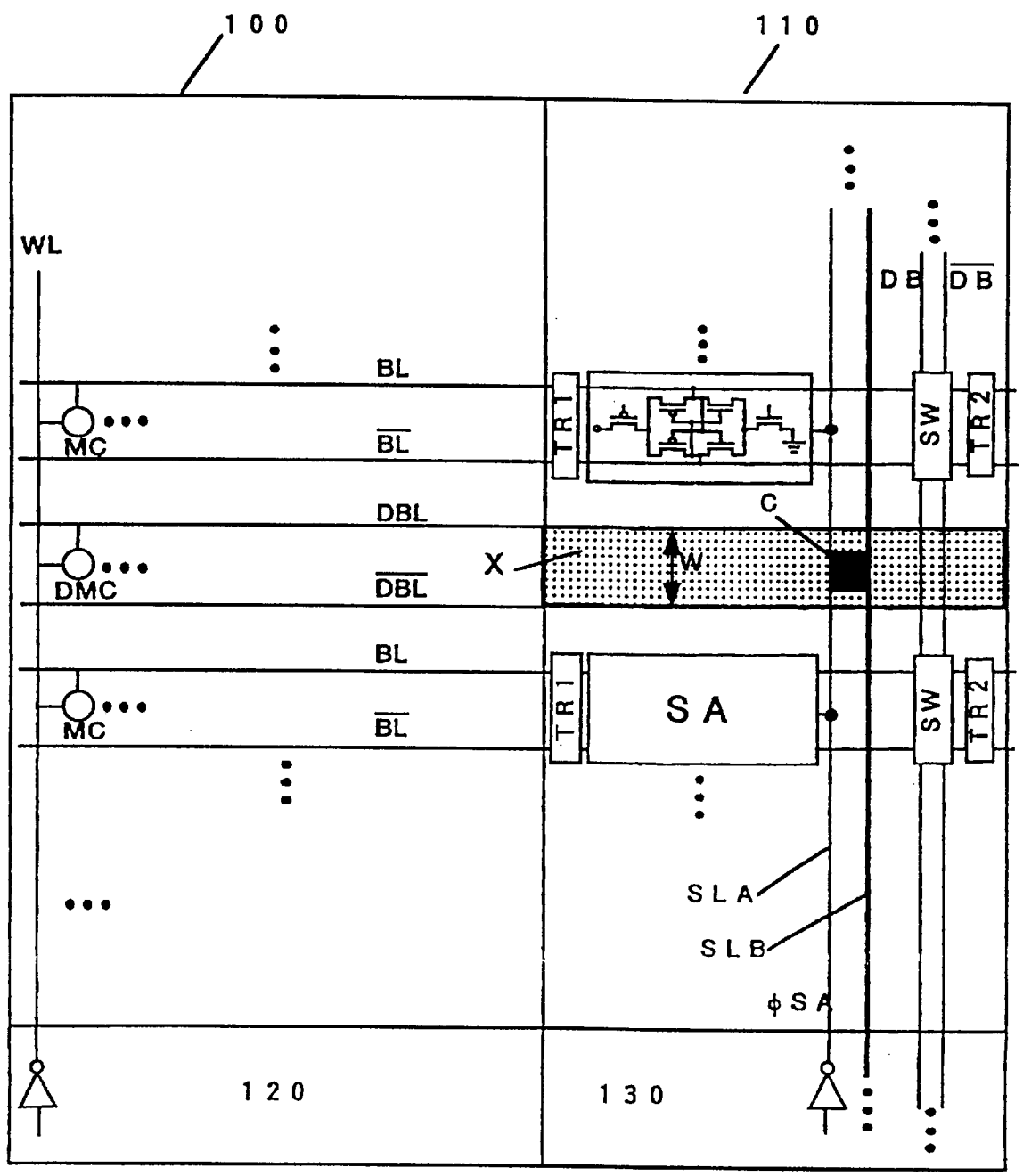
FIG. 1 is a view showing a layout of a semiconductor memory according to a first embodiment of the invention.

FIG. 1 is a partially exploded schematic view of a semiconductor memory comprising a memory cell array 100 in which a plurality of memory cells formed of DRAMs of the invention are arranged in a matrix shape, a sense amplifier array 110 in which a plurality of sense amplifiers are disposed, a row decoder 120 for selecting a desired word line WL out of a plurality of word lines in the memory cell array 100, a sense amplifier control portion 130 for applying a sense amplifier control signal to the sense amplifiers.

In the first embodiment, the sense amplifier array 110 is commonly used by the memory cell array 100 and another memory cell array (which is however arranged at the right side in FIG. 1, not shown). When transfer gates TR1 and TR2 are properly switched, the sense amplifier array 110 operates alternately for the memory cell array 100 or for another memory cell array, not shown. In this embodiment, the detailed explanation of the operation is omitted since this is not directly related to the invention. Although not shown, components having the same constructions as the memory cell array 100 and the sense amplifier array 110 are repeatedly disposed in the vertical direction of the drawing, which constitute the semiconductor memory.

A complementary bit line pair and word lines are arranged to cross with one another in the memory cell array 100. Memory cells MC each formed of one transistor one capacitor type are connected at the crossing points between the bit line pair BL, /BL and the word line WL.

Although the illustration is omitted, each memory cell MC comprises a capacitor and an n-channel transistor (hereinafter referred to as NMOS) for transferring electric charge. The capacitor is connected to a power supply having a fixed voltage. The NMOS is connected between the capacitor and the bit line pair BL or /BL, and its gate electrode is connected to the word line WL. The bit line pair BL, /BL are connected to sense amplifiers SA.

The sense amplifier SA amplifies the potential difference between the bit line pair BL, /BL. The sense amplifier SA is controlled by a sense amplifier control signal fSA. The sense amplifier control signal fSA is applied from the sense amplifier control portion 130 to the sense amplifier SA via a sense amplifier control signal line SLA. A sense amplifier control signal line SLB having a resistance which is lower than that of the sense amplifier control signal line SLA (hereinafter referred to as low resistance sense amplifier control signal line) is arranged in parallel with the sense amplifier control signal line SLA.

The concrete construction of the sense amplifier SA is typically illustrated in FIG. 1. The sense amplifier SA comprises a p-channel MOS transistor (hereinafter referred to as PMOSp1), an NMOSn1 wherein gate electrodes thereof are connected to the bit line BL, and a PMOSp2 and an NMOSn2 wherein gate electrodes thereof are connected to the bit line /BL.

These PMOSp1 and PMOSp2 and the NMOSn1 and NMOSn2 are cross-coupled between the bit line pair BL, /BL.

The sense amplifier SA further comprises a PMOSp3 which is connected between the power supply V cc having a power supply voltage (V cc level) and source electrodes of the PMOSp1 and PMOSp2. Further, an NMOSn3 is connected between a power supply V ss having a ground voltage (V ss level) and source electrodes of the NMOSn1 and NMOSn2. The sense amplifier control signal fSA is applied to a gate electrode of the PMOSp3. A sense amplifier control signal /fSA which is an inverted signal of the sense amplifier control signal fSA is applied to a gate electrode of the NMOSn3. Although the illustration is omitted, the gate electrode of the PMOSp3 and the sense amplifier control signal line SLA are directly connected to each other and the gate electrode of the NMOSn3 and the sense amplifier control signal line SLA are connected to each other via an inverter.

The row decoder 120 decodes a row address which is applied from the outside to select a row of the memory cell array 100. The row decoder 120 applies a row selection signal to a word line which is selected out of the word lines WL.

A column decoder, not shown, decodes a column address which is applied from the outside to select a column of the memory cell array 100. The column decoder applies a column selection signal to a switch circuit SW of the selected column.

Figure 2:
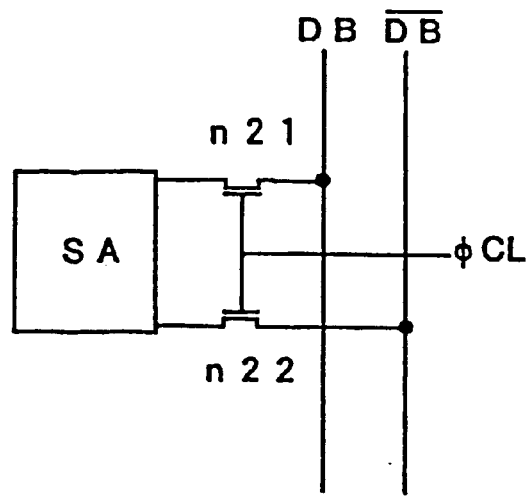
FIG. 2 is a circuit diagram of a switch according to the first embodiment of the invention.
Figure 3:
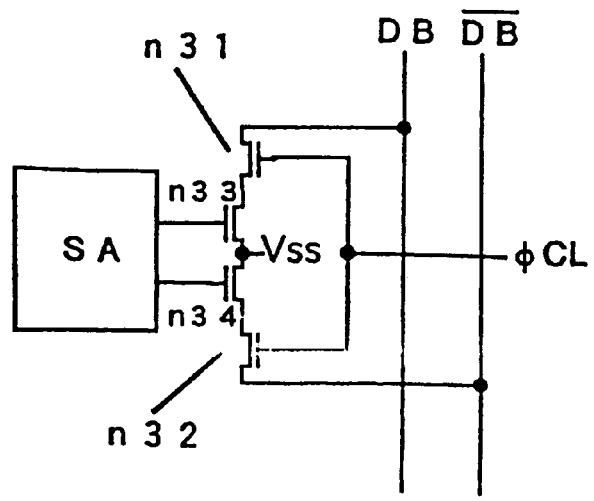
FIG. 3 is a circuit diagram of another switch according to the first embodiment of the invention.

Each switch circuit SW is connected between a data bus pair DB, /DB and transfers data on the bit line pair BL, /BL to the data bus pair DB, /DB in response to the column selection signal. The construction of the switch circuit SW is considered as follows. As shown in FIG. 2, an NMOSn21 and an NMOSn22 are respectively serially connected between the sense amplifier SA and the data bus pair DB, /DB. Alternatively, as shown in FIG. 3, the sense amplifier SA is connected to gate electrodes of NMOSn33 and NMOSn34 which are connected between a reference power supply V ss (having voltage which is sufficiently lower than the power supply V cc) and the data bus pair DB, /DB via an NMOSn31 and an NMOSn32.

In FIG. 1, a set of dummy bit line pair DBL, /DBL is arranged between a desired bit line pair and another bit line pair in the memory cell array 100. The dummy bit line pair DBL, /DBL are formed in the same manner as the bit line pair. A memory cell DMC having the same construction as the memory cell MC is connected at the crossing points between the dummy bit line pair DBL, /DBL and the word lines WL. That is, the desired bit line is selected out of a plurality of bit line pairs as the dummy bit line pair. A specific bit line pair in the memory cell array 100 which has many bit line pairs more than needed for operation are employed as the dummy bit line pair.

Since bit line pairs have to be arranged in the memory cell array corresponding to bits needed for operation, when the bit line pairs are formed, a bit line pair, which are intended to be employed as the dummy bit line pair, are formed or arranged in addition to the bit line pairs corresponding to the bits needed for operation.

Since the dummy bit line pair DBL, /DBL are not related to a normal operation such as reading operation of data which is stored in the memory cell, it is not necessary to dispose the sense amplifier SA in an area as marked X in the sense amplifier array 110 adjacent to the dummy bit line pair DBL, /DBL. The dummy bit line pair DBL, /DBL are different from the other bit line pair BL, /BL in that the dummy bit line pair DBL, /DBL are not connected to the sense amplifier SA. The sense amplifier SA is not disposed in the area X of the sense amplifier array 110 corresponding to the dummy bit line pair DBL, /DBL.

As a result, a free area X is formed in the sense amplifier array 110. The area X has at least a width W between the dummy bit line pair.

A contact portion C is formed in the area X for electrically connecting the sense amplifier control signal line SLA and the low resistance sense amplifier control signal line SLB. That is, the area X is utilized as a shunt area of the sense amplifier control signal line. Some areas X are provided in the direction where the sense amplifier control signal lines extend, and the contact portions C are formed in respective areas X.

Since the low resistance sense amplifier control signal line SLB is lower than the sense amplifier control signal line SLA in resistance, when both signal lines are connected to each other in the shunt area, the transmission speed of the sense amplifier control signal fSA which is applied to the sense amplifier control signal line SLA becomes fast.

Polysilicon which is frequently used as a gate electrode material of a MOS transistor is frequently employed by the sense amplifier control signal line SLA. In this embodiment, the sense amplifier control signal line SLA is formed of polysilicon. Meanwhile, the low resistance sense amplifier control signal line SLB is formed of tungsten which is lower than polysilicon in resistance. Materials of these wirings are not limited to polysilicon and tungsten, but may be properly selected by a designer if they satisfy resistance values therebetween.

Figure 4:
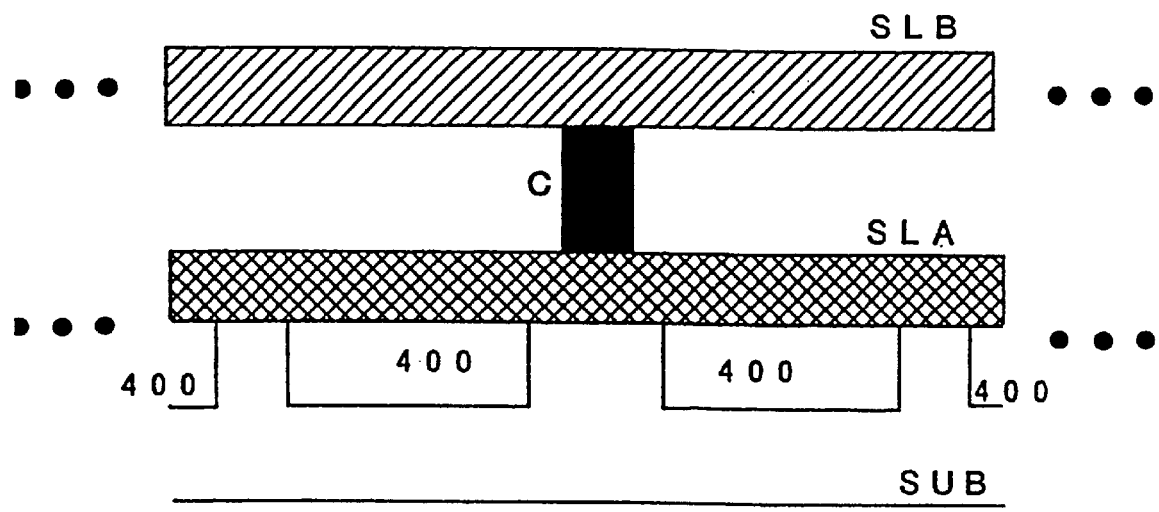
FIG. 4 is a partial sectional view of the semiconductor memory according to the first embodiment of the invention.

In this embodiment, the sense amplifier control signal line SLA is connected to the gate electrodes of the PMOSp3 of the sense amplifiers SA. FIG. 4 is a sectional view showing relationship between the sense amplifier control signal line SLA, the low resistance sense amplifier control signal line SLB and the contact portion C.

A polysilicon layer serving as the gate electrode of the PMOSp3 and also as the sense amplifier control signal line SLA stretches on a plurality of impurity areas 400 which are respectively formed in a substrate SUB. The polysilicon layer is connected to the low resistance sense amplifier control signal line SLB by the contact portion C. It is natural that an interlayer insulating film is formed between the polysilicon layer other than the contact portion C and the low resistance sense amplifier control signal line SLB.

Figure 5:
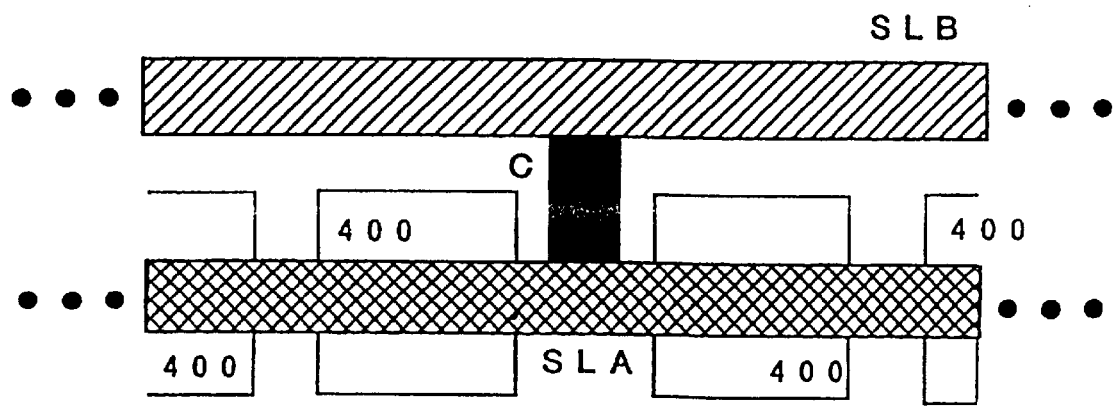
FIG. 5 is a partial plan view of the semiconductor memory according to the first embodiment of the invention.

FIG. 5 is a plan view showing the relationship between the sense amplifier control signal line SLA, the low resistance sense amplifier control signal line SLB and the contact portion C. It is understood that the contact portion C is formed between the respective impurity areas 400.

Although a set of dummy bit line pair are employed according to the first embodiment, it is possible to employ plural sets of dummy bit line pairs considering the dimensions of the contact portion C.

In the first embodiment, a set of dummy bit line pair are employed since an interval between the dummy bit line pair is 0.8 mm and the dimensions of the contact portion C are 0.5 mm×0.5 mm. A designer can properly set the number of set of bit line pairs considering the interval between the bit line pair and the dimensions of the contact portion. When only a set of dummy bit line pair are provided, it is preferable that the dummy bit line pair are provided substantially in the center of the memory cell array.

If a desired dummy bit line pair are provided in the memory cell array, a corresponding area is formed in the adjacent sense amplifier array. This area is utilized as an area for forming means to get rid of the delay of a signal which is produced associated with miniaturization.

Since the memory cell array area is the highly integrated portion in a semiconductor memory, particularly in a DRAM, it is impossible to provide a new shunt area in an arbitrary part of the DRAM. In this memory cell array, many memory cell patterns having the similar construction are repeatedly continuously formed with an arranging rule as disclosed in U.S. Pat. No. 5,359,216. It is impossible to form a shunt area in a desired portion of the patterns each having such a rule. Provision of a shunt area in the desired portion results in destruction of the arranging rule of the layout of the memory cell array. The destruction of the arranging rule causes various problems such as increase of occupying area, complexity of a fabrication process.

However, since the desired bit line pair are selected as the dummy bit line pair and the area in the sense amplifier array adjacent to the dummy bit line pair is employed as the shunt area according to the invention, the arranging rule for the memory cell array is not at all destroyed and the conventional fabrication process is not substantially changed.

Since several hundred sets of bit line pairs (520 sets of bit line pairs are formed in the memory cell array 100 in FIG. 1) are normally formed in the memory cell array, the increase of area is considered to be minimum even if one or several bit line pairs are added as the dummy bit line pair. Since the area increases to a minimum, the cause directly influencing the operation speed of the DRAM such as the delay of a sense amplifier control signal can be removed to the maximum extent.

Further, the excellent point of the invention is that a designer can set shunt areas in arbitrary positions in accordance with conditions. The design freedom can be enhanced by a large amount since the shunt areas can be set or provided considering characteristics of respective devices.

A semiconductor memory according to a second embodiment of the invention will be described next.

In the second embodiment, there is provided a power supply wiring or a ground wiring for applying a power supply voltage or a ground voltage to the aforementioned shunt area X. Further, there is formed a connecting portion in the aforementioned shunt area X for connecting between the power supply wiring or ground wiring and a well formed in a substrate SUB or the substrate SUB.

If the power supply wiring or the ground wiring is further provided in the shunt area, the lowering of resistance of the power supply wiring or that of the ground wiring in the semiconductor memory can be realized. As a result, a noise produced on the power supply wiring or on the ground wiring is reduced.

As the resistance between the power supply wiring and the well or the substrate lowers, it is considered that latch-up tolerance is improved. Since the formation of the connecting portion in the shunt area X for connecting between the power supply wiring or ground wiring and a well formed in a substrate SUB or the substrate SUB increases the number of connecting points between the wirings and the well or substrate compared with the conventional one, so that the lowering of resistance can be realized. Accordingly, the latch-up tolerance is improved.

A semiconductor memory according to a third embodiment of the invention will be described now with reference to FIG. 6. Although data bus pair alone are characteristically shown in FIG. 6 and other portions are not illustrated and explanation thereof is omitted, the omitted portions can be understood from the first and second embodiments set forth above.

The third embodiment provides a twist portion TW where a data bus pair DB, /DB cross with each other in a shunt area X. The twist portion TW is easily formed according to a normally-used fabricating method.

Since the twist portion TW is provided in the data bus pair, the capacity of wirings adjacent to the data bus pair and that of the data bus pair DB, /DB are equal to each other. That is, since the capacity of the data bus DB and that of the data bus /DB are equalized, the data bus pair DB, /DB are not influenced by the variation of the voltage even if the adjacent wirings produce a noise such as variation of the voltage.

It is decided, considering areas where the twist portions TW are formed, whether how many sets of dummy bit line pairs are provided in the memory cell array 100. In the third embodiment, since two sets of dummy bit pairs are provided, the width of the shunt area becomes 2W.

Figure 6:
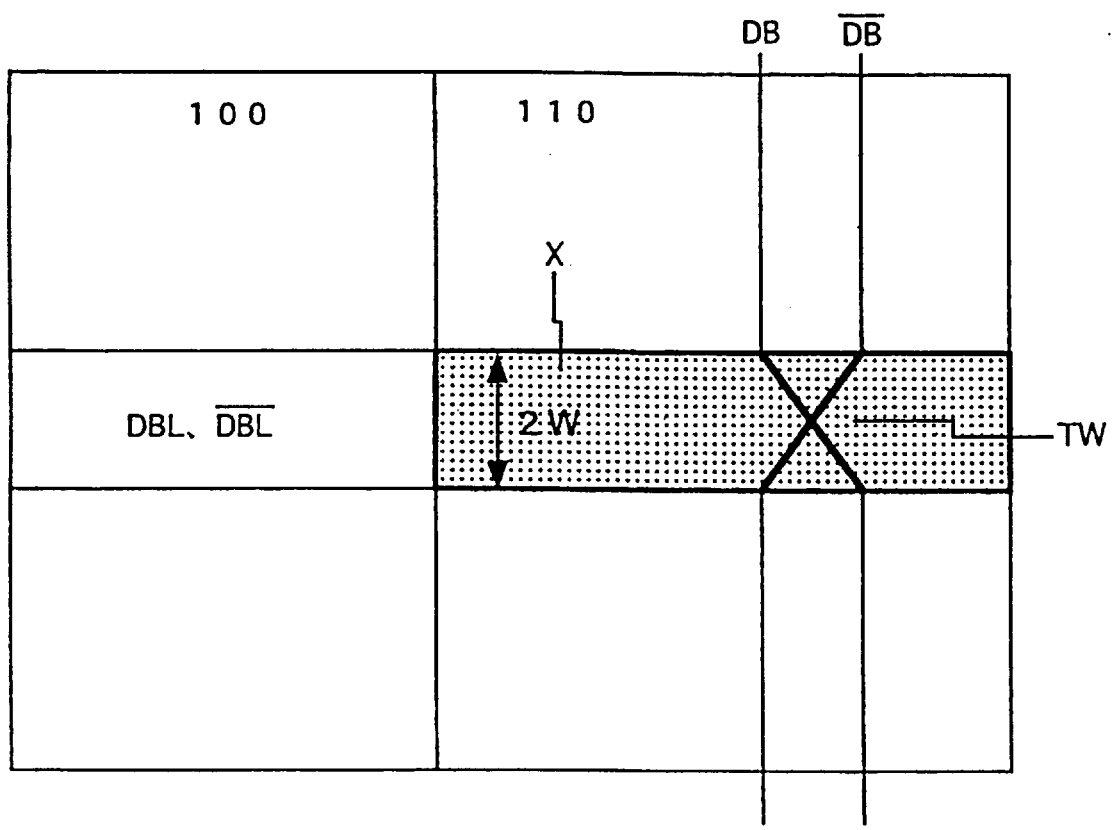
FIG. 6 is a view showing a layout of a semiconductor memory according to a third embodiment of the invention.

In the case of providing a single twist portion TW, it is preferable to provide the twist portion TW in the substantially central portion of the data bus pair as shown in FIG. 6, and hence the shunt area X is provided substantially in the central portion of the sense amplifier array 110.

Figure 7:
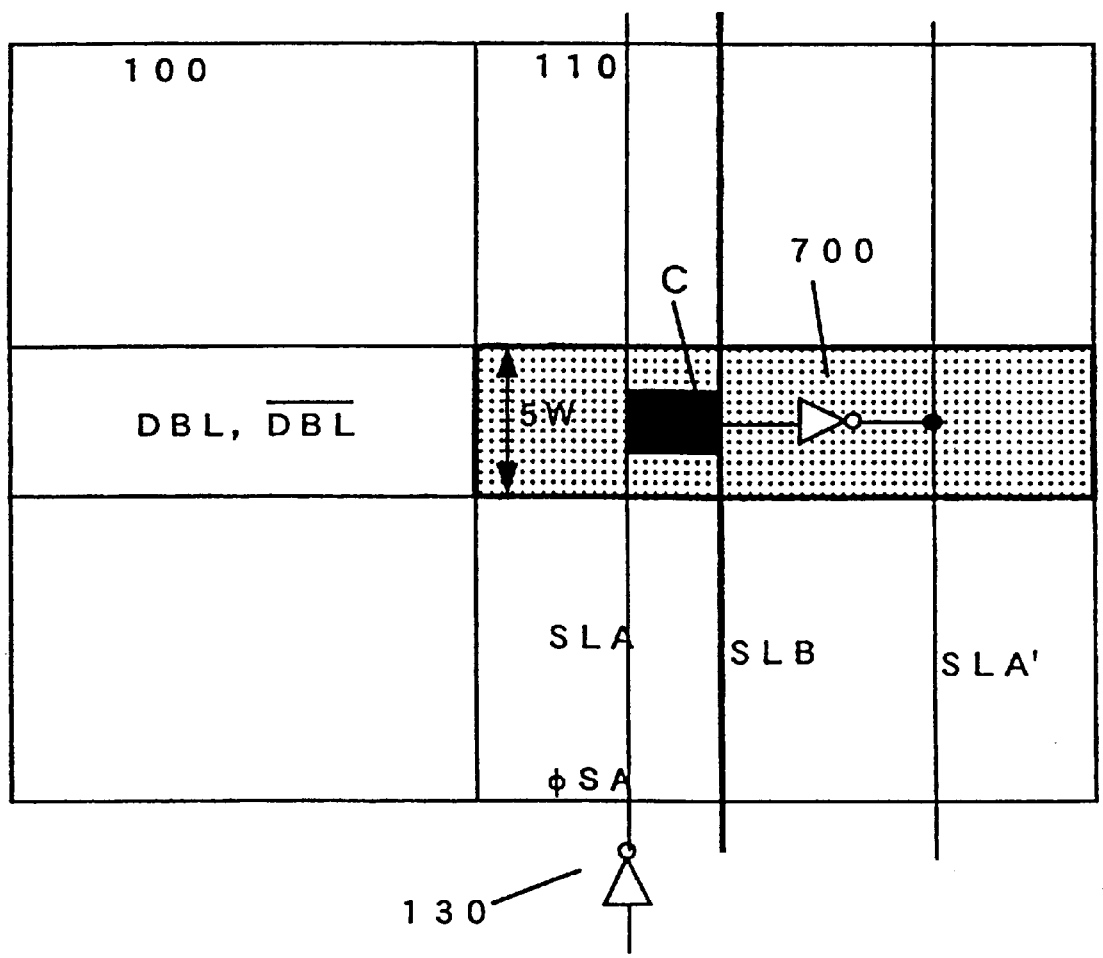
FIG. 7 is a view showing a layout of a semiconductor memory according to a fourth embodiment of the invention.

A semiconductor memory according to a fourth embodiment of the invention will be described now with reference to FIG. 7. Although sense amplifier control signal lines alone are characteristically shown in FIG. 7, and other portions are not illustrated and explanation thereof is omitted, the omitted portions can be understood from the first to third embodiments set forth above.

In the aforementioned embodiments, a single sense amplifier control signal line SLA is explained for facilitation of the explanation thereof. However, a plurality of sense amplifier control signal lines are practically formed in the sense amplifier array 110. A sense amplifier control signal line SLA' of a plurality of sense amplifier control signal lines is illustrated in FIG. 7.

In the fourth embodiment, a contact portion C and the sense amplifier control signal line SLA' are connected to each other in a shunt area X through a local driver 700 serving as a buffer circuit. Although an inverter is exemplified as the local driver 700 in the fourth embodiment, a concrete circuit can be properly selected by a designer.

Since the number of drivers formed in a sense amplifier control portion 130 can be reduced when the local driver 700 is disposed in the shunt area X, the area occupied by the sense amplifier control part 130 can be reduced. Further, since it is not necessary to provide a low resistance amplifier control signal line for the sense amplifier control signal line SLA', the number of the signal lines can be reduced by a large amount.

It is decided, considering areas where the local drivers 700 are formed, whether how many sets of dummy bit line pairs are provided in the memory cell array 100. In the fourth embodiment, since five sets of dummy bit pairs are provided, the width of the shunt area X becomes 5W.

Figure 8:
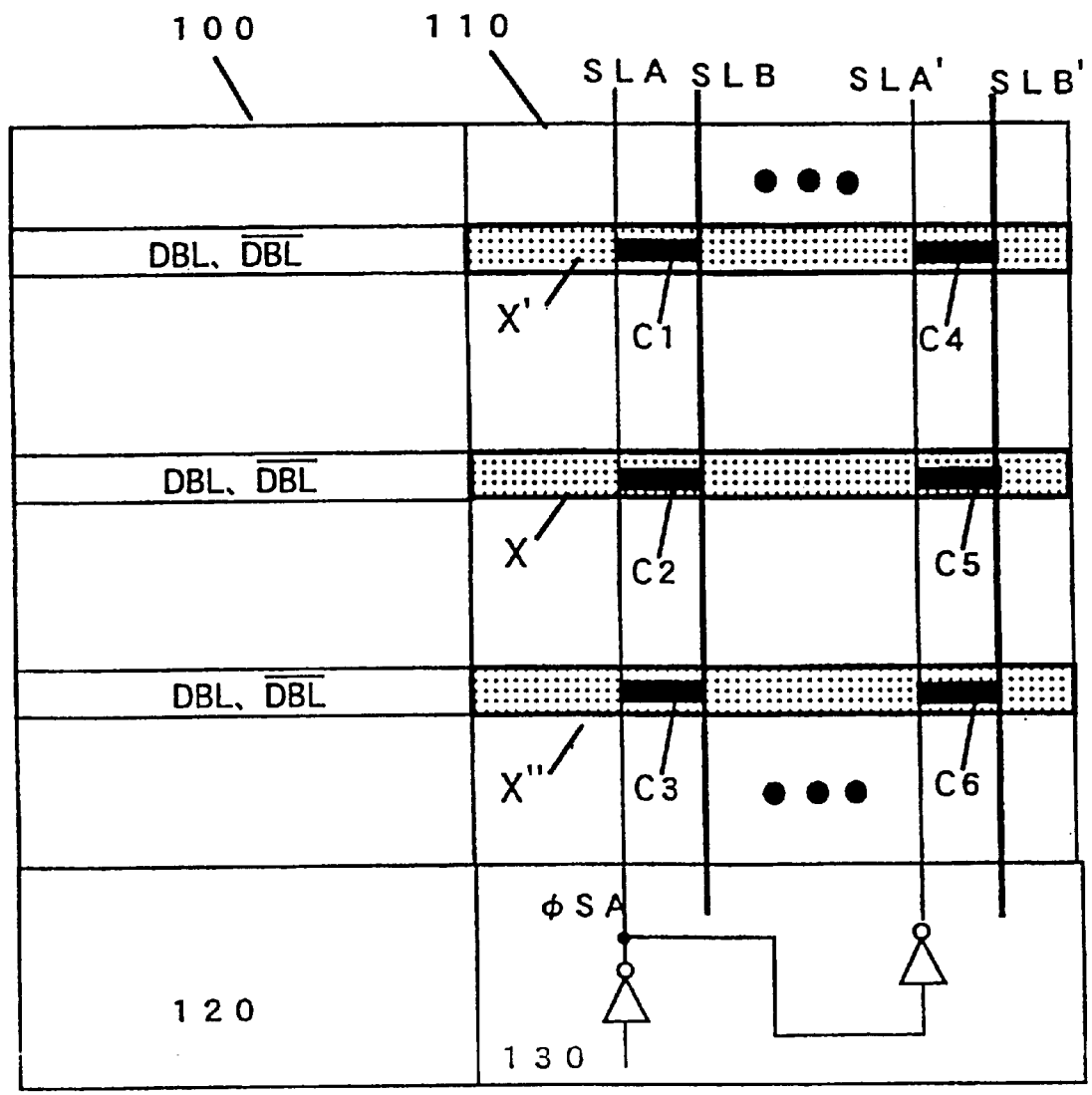
FIG. 8 is a view showing a layout of a semiconductor memory according to a fourth embodiment of the invention.

A semiconductor memory according to a fifth embodiment of the invention will be described now with reference to FIGS. 8 and 9. Although sense amplifier control signal lines alone are characteristically shown in FIGS. 8 and 9, and other portions are not illustrated and explanation thereof is omitted, the omitted portions can be understood from the first to fourth embodiments set forth above.

In the fifth embodiment, a shunt area X' and a shunt area X" are newly added to the shunt area X of the first embodiment. In the case that the shunt area X is formed substantially in the center of the memory cell array 100, the shunt area X' is formed substantially in the center between the shunt area X and the end of the memory cell array 100 (the upper end of the memory cell array 100 in FIGS. 8 and 9), and the shunt area X" is formed substantially in the center between the shunt area X and a row decoder 120.

There are provided contact portions C1, C2 and C3 in the shunt areas X, X' and X" for electrically connecting a sense amplifier control signal line SLA and a low resistance sense amplifier control signal line SLB. Similarly, contact portions C4, C5 and C6 are respectively formed in the shunt areas X, X' and X" for electrically connecting a sense amplifier control signal line SLA' and a low resistance sense amplifier control signal line SLB'.

With such a construction, there is obtained an effect that a transmission speed of the sense amplifier control signal becomes fast in addition to the effect obtained by the first embodiment.

Figure 9:
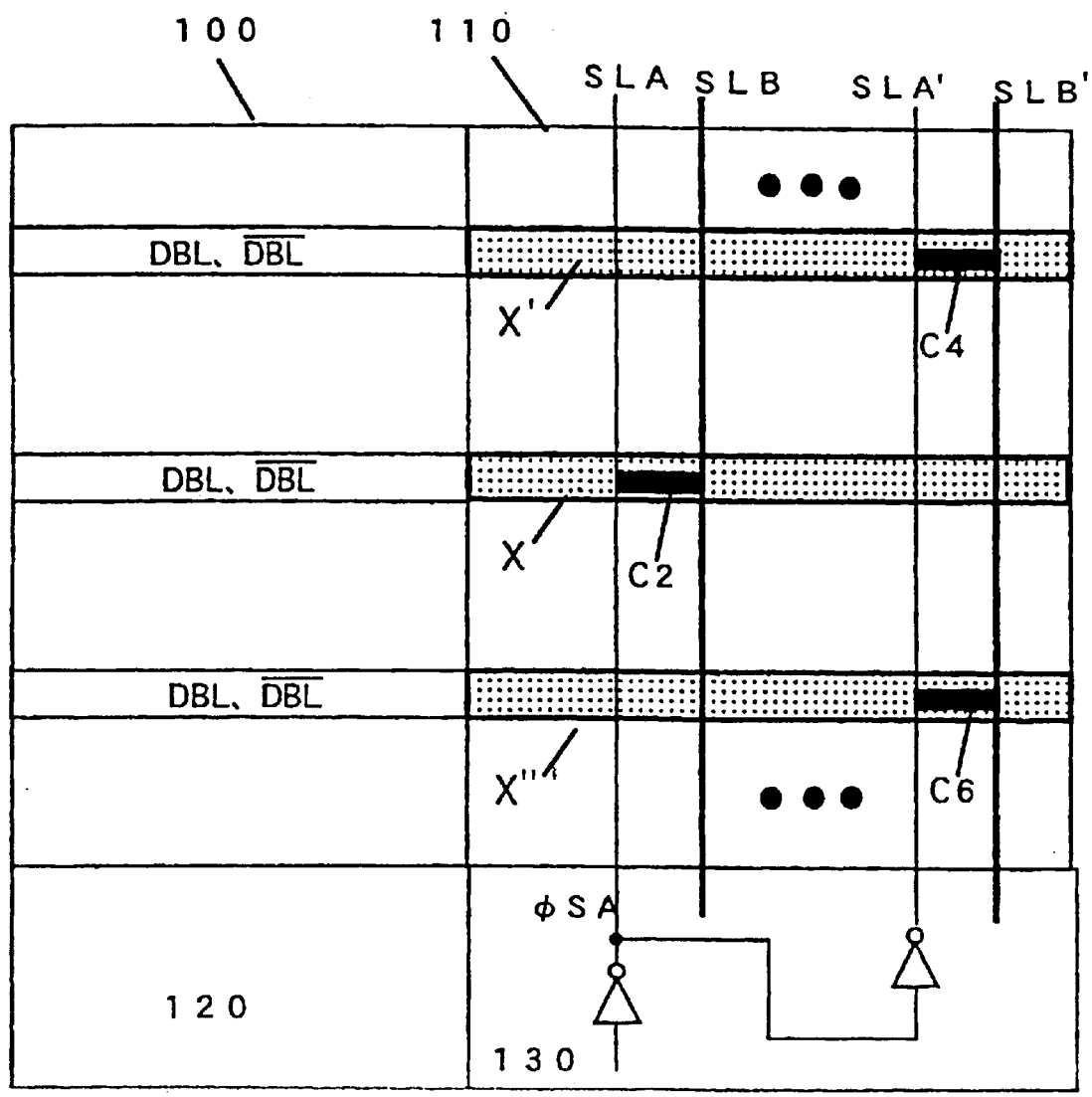
FIG. 9 is a view showing a layout of a semiconductor memory according to a fifth embodiment of the invention.

Further, a designer can adjust the number of contact portions in the shunt areas in accordance with the conditions as shown in FIG. 9. The contact portion C2 is formed in the shunt area X for electrically connecting the sense amplifier control signal line SLA and the low resistance sense amplifier control signal line SLB. Further, the contact portions C4 and C6 are respectively formed in the shunt areas X' and X" for electrically connecting the sense amplifier control signal line SLA' and the low resistance sense amplifier control signal line SLB'. In such a manner, the transmission speed of the control signal can be optimized.

Since the number of contact portions in the shunt areas can be set considering respective wirings, the design freedom is enhanced by a large amount.

In the fifth embodiment like the second embodiment, there is formed a power supply wiring or a ground wiring for applying a power supply voltage or a ground voltage to respective shunt areas X, X' and X". There are formed connecting portions in the shunt areas X, X' and X" for connecting between the power supply wiring or ground wiring and a well formed in a substrate SUB or the substrate SUB.

According to the fifth embodiment, the lowering of resistance of the power supply wiring or ground wiring in the semiconductor memory is further realized compared with that of the second embodiment. As a result, a noise produced on the power supply wiring or ground wiring can be reduced more than that of the second embodiment.

It is considered that the latch-up tolerance is improved as the resistance between the power supply wiring and the well or substrate lowers. The provision of the connecting portions for connecting between the power supply wiring or ground wiring and the well formed in the substrate SUB and the substrate SUB in the shunt areas X, X' and X" increases the number of connecting points between the wirings and well or substrate compared with that of the second embodiment, so that the lowering of resistance is further realized Accordingly the latch-up tolerance is improved more than that of the second embodiment.

Figure 10:
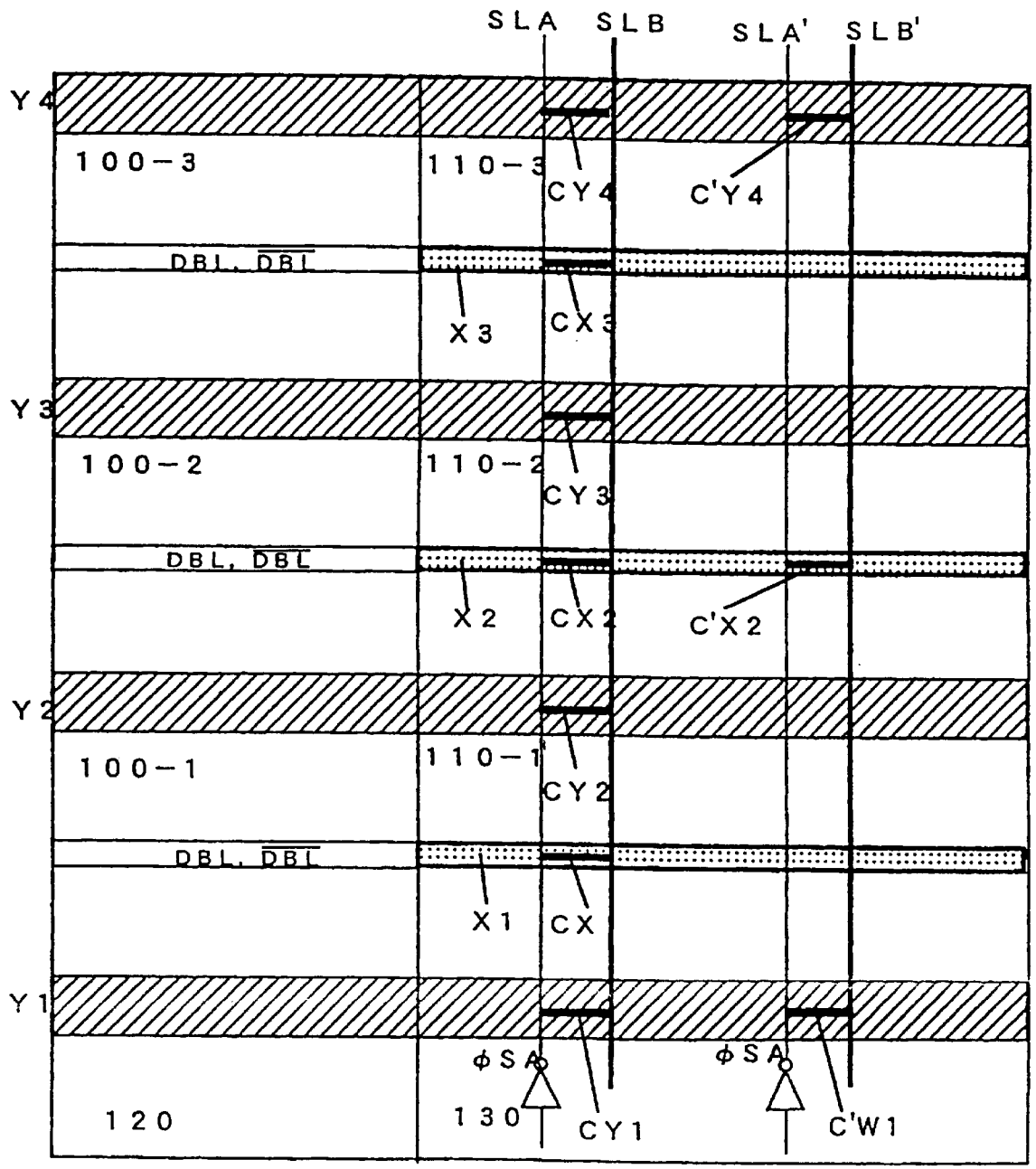
FIG. 10 is a view showing a layout of a semiconductor memory according to a sixth embodiment of the invention.

A semiconductor memory according to a sixth embodiment of the invention will be described now with reference to FIG. 10.

Although a single memory cell array and a single sense amplifier array are paid attention and mainly explained in the first to fifth embodiments, a plurality of memory cell arrays and sense amplifier arrays are exemplified and explained in the sixth embodiment. Although only the featured portions are illustrated and the other portions are not illustrated and the explanation thereof is omitted, the omitted portions can be understood from the first to fifth embodiments set forth above.

In the sixth embodiment, there are respectively arranged a word line shunt area Y1 between a row decoder 120 and a memory cell array 100-1, a word line shunt area Y2 between the memory cell array 100-1 and a memory cell array 100-2, and a word line shunt area Y3 between the memory cell array 100-2 and a memory cell array 100-3 and a word line shunt area Y4 at the end portion of the memory cell array 100-3.

These word line shunt areas are areas for connecting wirings adjacent to word lines and having resistance lower than the word lines and the word lines, as explained in the prior art of this application. Because of the provision of the word line shunt areas, signals applied to the word lines are transmitted at high speed. The word line shunt areas may be provided only between the memory cell array and the memory cell array. There is no design freedom in respect of the provision or arrangement of the word line shunt areas. The word line shunt areas extend also to the sense amplifier array. Since there is no bit line pair in the word line shunt areas of the memory cell array, it is a matter of course that a sense amplifier is not needed in the area of the sense amplifier array corresponding thereto. Accordingly, the word line shunt areas extend also to the sense amplifier array.

In the sixth embodiment, the shunt areas are formed in addition to the word line shunt areas which are fixed in the arranging positions.

A dummy bit line pair DBL, /DBL are formed in the memory cell array 100-1, and a word line shunt area X1 is formed in a sense amplifier array 110-1 corresponding thereto. Likewise, a dummy bit line pair DBL, /DBL are formed in the memory cell array 100-2, and a word line shunt area X2 is formed in a sense amplifier array 110-2 corresponding thereto. A dummy bit line pair DBL, /DBL are formed in the memory cell array 100-3, and a word line shunt area X3 is formed in a sense amplifier array 110-3 corresponding thereto.

Provided in the shunt areas X1, X2 and X3 are contact portions CX1, CX2 and CX3 for electrically connecting a sense amplifier control signal line SLA and a low resistance sense amplifier control signal line SLB. Likewise, provided in the shunt area X2 is a contact portions CX2 for electrically connecting a sense amplifier control signal line SLA' and a low resistance sense amplifier control signal line SLB'.

Further, provided in the word line shunt areas Y1, Y2, Y3 and Y4 of the sense amplifier array are contact portions CY1, CY2, CY3 and CY4 for electrically connecting the sense amplifier control signal line SLA and the low resistance sense amplifier control signal line SLB. Likewise, provided in the word line shunt areas Y1 and Y4 are contact portions CY1 and CY4 for electrically connecting the sense amplifier control signal line SLA' and the low resistance sense amplifier control signal line SLB'.

With such a construction, there is obtained an effect that the transmission speed of the sense amplifier control signal becomes fast in addition to the effect obtained by the first embodiment.

Further, according to the sixth embodiment, a designer can adjust the number of contact portions in the shunt areas in accordance with the conditions in the similar manner as the fifth embodiment shown in FIG. 9. In such a manner, the transmission speed of the control signal can be optimized. Since the contact portions in the shunt areas are set considering respective wirings, the design freedom can be enhanced by a large amount.

In the sixth embodiment, there is provided a power supply wiring or a ground wiring for applying a power supply voltage or a ground voltage to the shunt areas X1, X2 and X3 in the similar manner as the second embodiment. Further, there are provided connecting portions in the shunt areas X1, X2 and X3 for connecting between the power supply wiring or ground wiring and a well formed in a substrate SUB or the substrate SUB.

According to the sixth embodiment, the lowering of resistance of the power supply wiring or the ground wiring in the semiconductor memory is realized. As a result, a noise produced on the power supply wiring and the ground wiring can be reduced.

As the resistance between the power supply wiring and the well or the substrate lowers, it is considered that latch-up tolerance is improved. The provision of the connecting portions in the shunt areas X1, X2 and X3 for connecting between the power supply wiring or ground wiring and the well formed in the substrate SUB or the substrate SUB increases the number of connecting points between the wirings and the well or substrate, so that the lowering of resistance is further realized. Accordingly, the latch-up tolerance is improved.

If twist portions TWs of data bus pair are provided or local drivers are arranged in the shunt areas X1, X2 and X3 of the sixth embodiment in the similar manner as the third and fourth embodiments, the same effect as those of the third and fourth embodiments can be obtained.

However, if the twist portion TWs of the data bus pair are provided in the sixth embodiment, it is preferable to provide them in the shunt area X2 which is substantially in the center of the data bus pair because the capacitive balance between the data bus pairs is equalized.

As mentioned in detail above, since a desired dummy bit line pair are provided in the memory cell array, there is formed a corresponding area in the sense amplifier adjacent to the dummy bit line pair. This area is utilized for various purposes such as the formation of means to get rid of the delay of a signal which is produced associated with the miniaturization of the memory, the formation of a twist portion of the data bus pair, the formation of connecting portions between the power supply wiring or the ground wiring and the well or the substrate, the disposition of the local driver.

The selection of the desired bit line pair as the dummy bit line pair and the employment of the area in the sense amplifier array adjacent to the selected dummy bit line pair as the shunt area neither destroy an arranging rule of the memory cell array nor substantially change a conventional fabricating process.

Since several hundred sets of bit line pairs are normally formed in the memory cell array, the increase of area is considered to be minimum even if one or several bit line pairs are additionally formed in the memory cell array as the dummy bit line pair.

The increase of the area to the minimum leads to the expectation of various effects such as the prevention of delay of the sense amplifier control signals, the improvement of capacitive balance of the data bus, the improvement of the latch-up tolerance, the reduction of the sense amplifier control portion, the reduction of the number of sense amplifier control signal lines.

Further, according to the invention, a designer can set the shunt areas in arbitrary positions in accordance with the conditions. Since the shunt area can be set considering characteristics of respective devices, the design freedom is enhanced by a large amount.

Although the invention has been described with reference to exemplified embodiments, the invention is not limited to these embodiments. The modifications of these exemplified embodiments and other embodiments of the invention will be evident for a person skilled in the art when considering the description set forth hereinbefore. Accordingly, the scope of the appended claims is considered to include all the modifications of the embodiments and various embodiments as a true scope of claims.

What is claimed is:

1. A semiconductor memory circuit having a memory cell array and a sense amplifier array, comprising:
    a plurality of pairs of bit lines arranged in parallel with one another in the memory cell array, each of said pairs of bit lines disposed within a predetermined width, said pairs of bit lines including a plurality of first pairs of bit lines and a second pair of bit lines;
    a pair of data buses substantially arranged in perpendicular to the pairs of bit lines in the sense amplifier array;
    a plurality of sets of peripheral circuits formed in the sense amplifier array with the predetermined width, each set of the peripheral circuits being electrically connected to one of the first pairs of bit lines and the pair of data buses, each set of the peripheral circuits located at a corresponding area of the corresponding one of the first pairs of bit lines; and
    an independent circuit located at a corresponding area of the second pair of bit lines in the sense amplifier array within the predetermined width, wherein said independent circuit is not electrically connected to said pairs of bit lines.

2. The semiconductor memory circuit according to claim 1, wherein each of said peripheral circuits includes a sense amplifier for amplifying a potential between one of the first pairs of bit lines, a transfer circuit connecting said corresponding one of the first pairs of bit lines with the sense amplifier, and a switching circuit connecting the sense amplifier with the pair of data buses.

3. The semiconductor memory circuit according to claim 1, further comprising:
    a main sense amplifier control line having a first resistance value formed in the sense amplifier array, said main sense amplifier control line being substantially arranged in perpendicular to the pairs of bit lines, and
    a sub sense amplifier control line having a second resistance value which is lower than the first resistance value, said sub sense amplifier control line being substantially arranged in perpendicular to the pairs of bit lines in the sense amplifier array, and wherein said main sense amplifier control line and said sub sense amplifier control line are electrically connected in an area where said independent circuit is located.

4. The semiconductor memory circuit according to claim 3, wherein said main sense amplifier control line is formed of a first conductive layer, and said sub sense amplifier control line is formed of a metal layer formed over the first conductive layer.

5. The semiconductor memory circuit according to claim 3, further comprising an inverted sense amplifier control line having the first resistance value formed in the same amplifier array, said inverted sense amplifier control line being substantially arranged in perpendicular to the pairs of bit lines, and wherein said independent circuit includes an inverter connected between said sub sense amplifier control line and said inverted sense amplifier control line.

6. The semiconductor memory circuit according to claim 1, wherein said data buses cross with each other at an area where said independent circuit is formed.

7. A semiconductor memory circuit having a memory cell array and a sense amplifier array, comprising:
    a plurality of pairs of first bit lines arranged in parallel with one another in the memory cell array, each of said pairs of first bit lines disposed within a first width;
    a pair of second bit lines arranged in parallel with the first bit lines in the memory cell array, said second bit lines disposed within a second width which is larger than the first width;
    a pair of data buses substantially arranged in perpendicular to the pairs of bit lines in the sense amplifier array;
    a plurality of sets of peripheral circuits formed in the sense amplifier array within the first width, each set of the peripheral circuits being electrically connected to one of the first pairs of bit lines and the pair of data buses, each set of the peripheral circuits located at a corresponding area of the corresponding one of the first pairs of bit lines; and
    an independent circuit located at a corresponding area of the second pair of bit lines in the sense amplifier array within the second width, wherein said independent circuit is not electrically connected to said pairs of first bit lines and second pair of bit lines.

8. The semiconductor memory circuit according to claim 7, wherein the second width is twice of the first width.

9. The semiconductor memory circuit according to claim 7, wherein the second width is five times of the first width.

10. The semiconductor memory circuit according to claim 7, wherein each of said peripheral circuits includes a sense amplifier for amplifying a potential between one of the first bit lines pairs, a transfer circuit connecting said corresponding one of the first bit lines pairs with the sense amplifier, and a switching circuit connecting the sense amplifier with the pair of data buses.

11. The semiconductor memory circuit according to claim 7, further comprising:
    a main sense amplifier control line having a first resistance value formed in the sense amplifier array, said main sense amplifier control line being substantially arranged in perpendicular to the pairs of first bit lines and second pair of bit lines, and a sub sense amplifier control line having a second resistance value which is lower than the first resistance value, said sub sense amplifier control line being substantially arranged in perpendicular to the pairs of first bit lines and second pair of bit lines in the sense amplifier array, and wherein said main sense amplifier control line and said sub sense amplifier control line are electrically connected in an area where said independent circuit is located.

12. The semiconductor memory circuit according to claim 11, wherein said main sense amplifier control line is formed of a first conductive layer, and said sub sense amplifier control line is formed of a metal layer formed over the first conductive layer.

13. The semiconductor memory circuit according to claim 11, further comprising an inverted sense amplifier control line having the first resistance vale formed in the sense amplifier array, said inverted sense amplifier control line being substantially arranged in perpendicular to the pairs of first bit lines and second pair of bit lines, and wherein said independent circuit includes an inverter connected between said sub sense amplifier control line and said inverted sense amplifier control line.

14. The semiconductor memory circuit according to claim 7, wherein said data buses cross with each other at an area where said independent circuit is formed.

15. A semiconductor memory circuit having a memory cell array and a sense amplifier array, comprising:

a plurality of pairs of bit lines arranged in parallel with one another in the memory cell array, each of said pairs of bit lines disposed within a predetermined width, said pairs of bit lines including a plurality of first pairs of bit lines and a second pair of bit lines;

a pair of data buses substantially arranged in perpendicular to the pairs of bit lines in the sense amplifier array;

a plurality of sets of peripheral circuits formed in the sense amplifier array within the predetermined width, each set of the peripheral circuits being electrically connected to one of the first pairs of bit lines and the pair of data buses, each set of the peripheral circuits located at a corresponding area of one of the first pairs of bit lines; and an independent circuit area located at a corresponding area of the second pair of bit lines in the sense amplifier array within the predetermined width, wherein an independent circuit having no electrical connection with said pairs of bit lines is formed in said independent circuit area.

16. The semiconductor memory circuit according to claim 15, wherein each of said peripheral circuits includes a sense amplifier for amplifying a potential between one of the first pairs of bit lines, a transfer circuit connecting said corresponding one of the first pairs of bit lines, a transfer circuit connecting the first pair of bit lines with the sense amplifier, and a switching circuit connecting the sense amplifier with the pair of data buses.

17. The semiconductor memory circuit according to claim 15, further comprising:

a main sense amplifier control line having a first resistance vale formed in the sense amplifier array, said main sense amplifier control line being substantially arranged in perpendicular to the pairs of bit lines, and a sub sense amplifier control line having a second resistance value which is lower than the first resistance value, said sub sense amplifier control line being substantially arranged in perpendicular to the pairs of bit lines in the sense amplifier array, and wherein said main sense amplifier control line and said sub sense amplifier control line are electrically connected in said independent circuit area.

18. The semiconductor memory circuit according to claim 17, wherein said main sense amplifier control is formed of a first conductive layer, and said sub sense amplifier control line is formed of a metal layer formed over the fist conductive layer.

19. The semiconductor memory circuit according to claim 17, further comprising an inverted sense amplifier control line having the first resistance value formed in the sense amplifier array, said inverted sense amplifier control line being substantially arranged in perpendicular to the pairs of bit lines, and wherein the independent circuit includes an inverter connected between said sub sense amplifier control line and said inverted sense amplifier control line.

20. The semiconductor memory circuit according to claim 17, wherein said data buses cross with each other in said independent circuit area.

* * * * *